United States Patent
Sakamoto et al.

(10) Patent No.: US 8,410,663 B2
(45) Date of Patent: Apr. 2, 2013

(54) PIEZOELECTRIC ACTUATOR UNIT HAVING A STRESS RELIEVING LAYER AND METHOD FOR MANUFACTURING THE SAME

(75) Inventors: Takami Sakamoto, Kirishima (JP); Masahiro Inagaki, Kirishima (JP); Harald-Johannes Kastl, Fichtelberg (DE); Carsten Schuh, Baldham (DE); Bernhard Doellgast, Flurweg (AT); Atsushi Ochi, Yokohama (JP)

(73) Assignees: Kyocera Corporation, Kyoto (JP); Continental Automotive GmbH, Hanover (DE)

( * ) Notice: Subject to any disclaimer, the term of this patent is extended or adjusted under 35 U.S.C. 154(b) by 491 days.

(21) Appl. No.: 12/446,175

(22) PCT Filed: Oct. 20, 2006

(86) PCT No.: PCT/JP2006/321442
§ 371 (c)(1),
(2), (4) Date: Sep. 8, 2009

(87) PCT Pub. No.: WO2008/047460
PCT Pub. Date: Apr. 24, 2008

(65) Prior Publication Data
US 2010/0327704 A1 Dec. 30, 2010

(51) Int. Cl.
*H01L 41/083* (2006.01)
(52) U.S. Cl. .................................. 310/328; 310/366
(58) Field of Classification Search .............. 310/328, 310/366
See application file for complete search history.

(56) References Cited

U.S. PATENT DOCUMENTS

| 4,903,166 | A | 2/1990 | Galvagni | 361/321 |
| 6,930,438 | B2 * | 8/2005 | Cramer et al. | 310/328 |
| 7,323,807 | B2 * | 1/2008 | Sasaki | 310/366 |
| 7,358,655 | B2 * | 4/2008 | Ragossnig et al. | 310/358 |
| 7,579,756 | B2 * | 8/2009 | Althoff et al. | 310/328 |
| 7,594,309 | B2 * | 9/2009 | Iwase et al. | 29/25.35 |
| 8,007,903 | B2 * | 8/2011 | Okamura et al. | 428/316.6 |
| 8,104,693 | B2 * | 1/2012 | Ono | 239/102.2 |
| 8,212,451 | B2 * | 7/2012 | Inagaki et al. | 310/328 |
| 8,288,921 | B2 * | 10/2012 | Terazono et al. | 310/328 |

(Continued)

FOREIGN PATENT DOCUMENTS

| DE | 102 34 737 | 10/2003 |
| DE | 103 07 825 | 9/2004 |

(Continued)

*Primary Examiner* — Jaydi San Martin
(74) *Attorney, Agent, or Firm* — DLA Piper LLP (US)

(57) ABSTRACT

A piezoelectric actuator unit which undergoes less change in the amount of displacement and shows high durability in continuous operation under a high voltage and a high pressure over a long period of time is provided.

The piezoelectric actuator unit including a multi-layer piezoelectric element having piezoelectric layers and metal layers with the piezoelectric layers and the metal layers being stacked one on another, and a case which houses the multi-layer piezoelectric element, wherein at least one of the plurality of metal layers is stress relieving layer which consists of a plurality of partial metal layers that are scattered throughout the entire region between two piezoelectric layers which adjoin the partial metal layers in the direction of stacking, and voids, and a peel-off section is formed at least in a part of the interface between the stress relieving layer and the piezoelectric layer that adjoins therewith.

8 Claims, 6 Drawing Sheets

U.S. PATENT DOCUMENTS

| | | |
|---|---|---|
| 2006/0181178 A1 | 8/2006 | Kastl et al. .................... 310/328 |
| 2006/0238073 A1 | 10/2006 | Ragossnig et al. ............ 310/328 |
| 2008/0315717 A1* | 12/2008 | Schroder et al. .............. 310/311 |
| 2009/0162706 A1* | 6/2009 | Okamura et al. ................ 429/12 |
| 2010/0019620 A1* | 1/2010 | Kastl et al. .................... 310/311 |
| 2010/0072306 A1* | 3/2010 | Ono .............................. 239/584 |
| 2010/0139621 A1* | 6/2010 | Murai et al. ................... 123/472 |
| 2010/0140379 A1* | 6/2010 | Suzuki et al. ................. 239/569 |
| 2010/0237751 A1* | 9/2010 | Bosch et al. .................. 310/366 |
| 2010/0327704 A1* | 12/2010 | Sakamoto et al. ............. 310/365 |

FOREIGN PATENT DOCUMENTS

| | | |
|---|---|---|
| DE | 10 2004 031 404 A1 | 2/2006 |
| DE | 10 2004 050 803 A1 | 4/2006 |
| EP | 1 653 527 A1 | 5/2006 |
| JP | 2006173348 A * | 6/2006 |
| JP | 2006351602 A * | 12/2006 |

* cited by examiner

PRIOR ART

Fig. 6(b)

PRIOR ART

PIEZOELECTRIC ACTUATOR UNIT HAVING A STRESS RELIEVING LAYER AND METHOD FOR MANUFACTURING THE SAME

FIELD OF THE INVENTION

The present invention relates to a piezoelectric actuator unit used in, for example, fuel injection apparatus of automobile engine, liquid injection apparatus of ink jet printer or the like, precision positioning device or vibration preventing device for optical apparatus or the like.

BACKGROUND OF THE INVENTION

There have been known piezoelectric actuator units comprising a multi-layer piezoelectric element (may be hereinafter referred to simply as an element), which is constituted from piezoelectric layers and internal electrode layers made of a metal stacked alternately one on another, housed in a case that is formed from a metal or a plastic material. The multi-layer piezoelectric elements can be divided into two categories: fired-at-once type and stacked type. Among these, the multi-layer piezoelectric element of fired-at-once type is more advantageous for the reason of possibility to make the layer thickness smaller, higher durability, lower operating voltage and lower manufacturing cost.

Figure 6A:
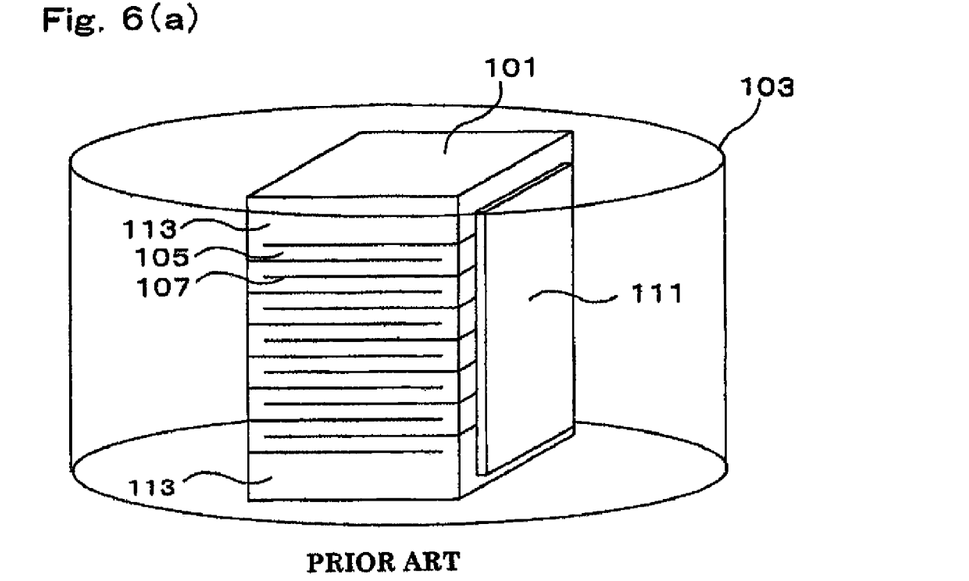
FIG. 6(a) is a perspective view showing the multi-layer piezoelectric element of the prior art.
Figure 6B:
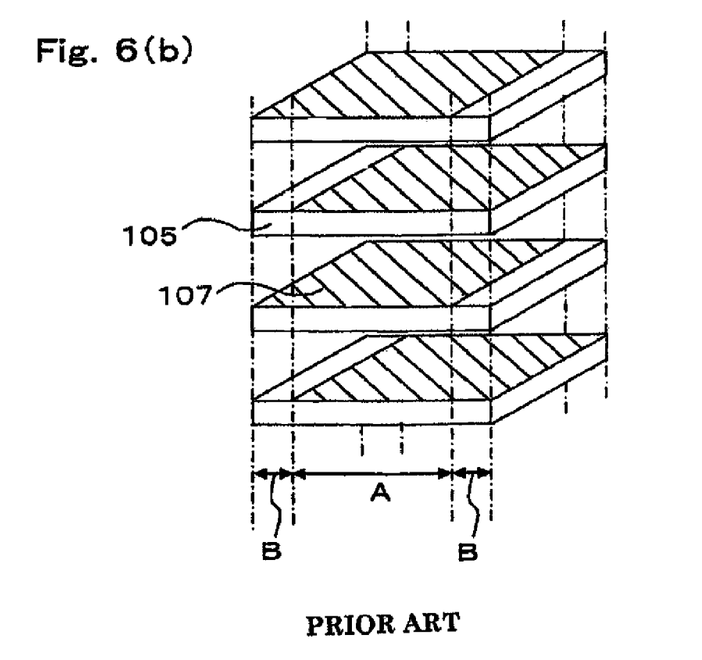
FIG. 6(b) is a partial perspective view showing the piezoelectric layers and the metal layers being stacked one on another.

FIG. 6(a) is a perspective view of a multi-layer piezoelectric element of the prior art. This multi-layer piezoelectric element is constituted from a stack 103 and external electrodes 105 formed on a pair of opposing side faces thereof. The stack 103 is formed by stacking piezoelectric layers 101 and internal electrode layers 102 alternately one on another. The internal electrodes 102 are not formed over the entire principal surfaces of the piezoelectric layers 101, but have a so-called partial electrode structure. FIG. 6(b) is an exploded perspective view of a part of the element shown in FIG. 6(a) explanatory of the partial electrode structure. As shown in FIG. 6(b), the internal electrodes 102 are stacked in a staggered manner so as to be exposed alternately on the left side face of the stack 103 in one layer and then on the right side face of the stack 103 in the next layer. With this constitution, the internal electrodes 102 are connected to a pair of external electrodes in every other layer. Inactive layers 104 are stacked on both end faces of the stack 103 in the direction of stacking.

The multi-layer piezoelectric element is covered on the surface with a resin or the like, so as to isolate the electrodes of different polarities from each other. Then the multi-layer piezoelectric element is housed in a case formed from a metal or a plastic material, thereby completing a piezoelectric actuator unit. The piezoelectric actuator unit having the constitution described above, unlike multi-layer electronics components such as capacitor, undergoes continuous dimensional change when operated.

The multi-layer piezoelectric element having the partial electrode structure shown in FIG. 6(a), (b) has a region (active region) 103a where the internal electrodes 102 of different polarities oppose each other via the piezoelectric layer 101 so as to generate an electric field, and a region (inactive region) 103b where internal electrodes of different polarities do not oppose each other via the piezoelectric layer 101 and therefore an electric field is not generated.

DISCLOSURE OF THE INVENTION

As shown in FIG. 6(a) and FIG. 6(b), the multi-layer piezoelectric element having the partial electrode structure has an active region A where metal layers 107 of different polarities oppose each other via the piezoelectric layer 105, and an inactive region B where metal layers 107 of different polarities do not oppose each other via the piezoelectric layer 105. Therefore, when the piezoelectric actuator unit is driven, since only the active region A undergoes displacement while the inactive region B does not, stress is concentrated in the interface between the active region A and the inactive region B, which may become the start point of the growth of crack.

Also as shown in FIG. 6(a), the multi-layer piezoelectric element 101 has inactive layers 113 stacked on both end faces thereof in the direction of stacking. Therefore, when the piezoelectric actuator unit is driven, since the inactive layers 113 do not undergo displacement, stress is concentrated in the interface between the layers undergoing displacement and the inactive layers, which may become the start point of the growth of crack.

The crack described above may develop from the interface toward a side face (on the inactive region B side) of the stack 109, but may also develop toward the inside (on the active region A side) of the stack 109. When an electric field is generated in the space between the opposing metal layers 107, the active region A expands in the direction of the electric field due to the reverse piezoelectric effect, and shrinking displacement occurs in a plane perpendicular to the expansion. When the piezoelectric layers 105 expand in the direction of the electric field, the entire element 101 expands in the direction of stacking. In case the element 101 is housed in a case or frame that constrains the expansion, a compressive stress is generated as a reaction thereto in the element 101.

A crack which has started in the interface and grown to the active region 103a side may develop in the direction of thickness of the piezoelectric layers 105 while deflecting or branching depending on the state of the stress. When a crack which develops in the direction of thickness of the piezoelectric layers 105 occurs between the opposing metal layers 107, short-circuiting may take place between the metal layers 107 and make the amount of displacement of the piezoelectric actuator unit smaller.

Moreover, as the piezoelectric actuator unit becomes smaller in size and is required to make larger amount of displacement under a higher pressure in recent years, it is subjected to higher electric field. There is further requirement for the piezoelectric actuator unit to endure continuous operation over a long period of time. To meet these requirements, such a multi-layer piezoelectric element is proposed that has a stress relieving layer provided inside thereof (refer to, for example, DE10234787A1 and DE10307825A1). However, the piezoelectric actuator unit of the prior art having the stress relieving layer in the multi-layer piezoelectric element does not necessarily have the durability to endure the conditions of continuous operation under a high pressure over a long period of time.

An object of the present invention is to provide a piezoelectric actuator unit which undergoes less change in the amount of displacement and shows high durability in continuous operation under a high voltage and a high pressure over a long period of time, and a method for manufacturing the same.

The piezoelectric actuator unit of the present invention comprises a multi-layer piezoelectric element having a plurality of piezoelectric layers and a plurality of metal layers with the piezoelectric layers and the metal layers being stacked one on another, and a case which houses the multi-layer piezoelectric element, wherein at least one of the plurality of metal layers is stress relieving layer which consists of a plurality of partial metal layers that are scattered throughout the entire region between two piezoelectric layers which adjoin the partial metal layers in the direction of stacking, and voids, and a peel-off section is formed at least in a part of the interface between the stress relieving layer and the piezoelectric layer that adjoins therewith.

The piezoelectric actuator unit of the present invention preferably has such a constitution as a plurality of the stress relieving layers are disposed in the direction of stacking of the multi-layer piezoelectric element. The piezoelectric actuator unit of the present invention more preferably has such a constitution as the stress relieving layers are disposed in a regular arrangement in the direction of stacking of the multi-layer piezoelectric element.

The method for manufacturing the piezoelectric actuator unit of the present invention comprises a process of making the multi-layer piezoelectric element which includes the stress relieving layer consisting of the plurality of partial metal layers that are scattered throughout the entire region between two piezoelectric layers adjoining in the direction of stacking and voids, and a process of forming the peel-off section at least in a part of the interface between the stress relieving layer and the piezoelectric layer that adjoins therewith by applying polarization treatment under the condition that the multi-layer piezoelectric element is housed in the case.

According to the present invention, since at least one of the plurality of metal layers is the stress relieving layer which consists of a plurality of the partial metal layers that are scattered throughout the entire region between two piezoelectric layers adjoining in the direction of stacking and the voids, and the peel-off section is formed at least in a part of the interface between the stress relieving layer and the piezoelectric layer which adjoins therewith, cracks can be prevented from growing in the direction of, thickness of the piezoelectric layer Specifically, since the stress relieving layer consisting of the plurality of the partial metal layers and the voids has a lower strength of bonding with, the piezoelectric layer than other metal layers, stress generated in the element 101 causes peeling to start in the peel-off section and proceed along the interface between the stress relieving layer and the piezoelectric layer that adjoins therewith. As a result, cracks can be prevented from growing in the direction of thickness of the piezoelectric layer, so that the amount of displacement of the element 101 can be suppressed from changing.

| DESCRIPTION OF REFERENCE NUMERALS | |
|---|---|
| 1: | the multi-layer piezoelectric element |
| 3: | case |
| 3a: | lid |
| 5: | piezoelectric layer |
| 7: | metal layer |
| 7a: | internal electrode layer |
| 7b: | stress relieving layer |
| 9: | stack |
| 11: | external electrode |
| 13: | inactive layer |
| 15: | peel-off layer |
| 17: | filling material |
| 19: | no-electrode section |
| 31: | container |
| 33: | injection hole |
| 35: | valve |
| 37: | fuel passage |
| 39: | cylinder |
| 41: | piston |
| 43: | piezoelectric actuator unit |
| 71: | partial metal layer (metal particles) |
| 72: | void |

BEST MODE FOR CARRY OUT THE INVENTION

Piezoelectric Actuator Unit

Figure 1A:
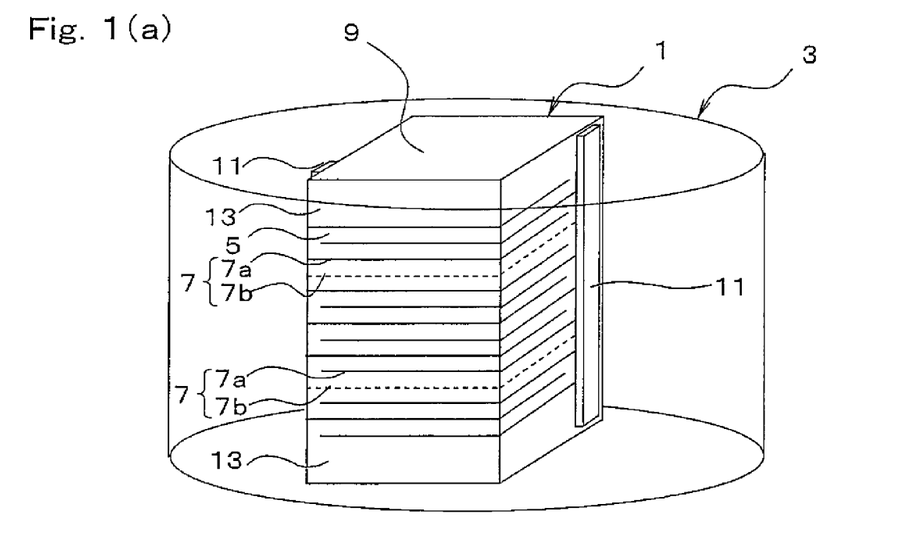
FIG. 1(a) is a perspective view showing the piezoelectric actuator unit according to the embodiment of the present invention.

The piezoelectric actuator unit according to one embodiment of the present invention will now be described in detail with reference to the accompanying drawings. FIG. 1(a) is a perspective view showing the piezoelectric actuator unit according to this embodiment, and FIG. 1(b) is a sectional view thereof.

Figure 1B:
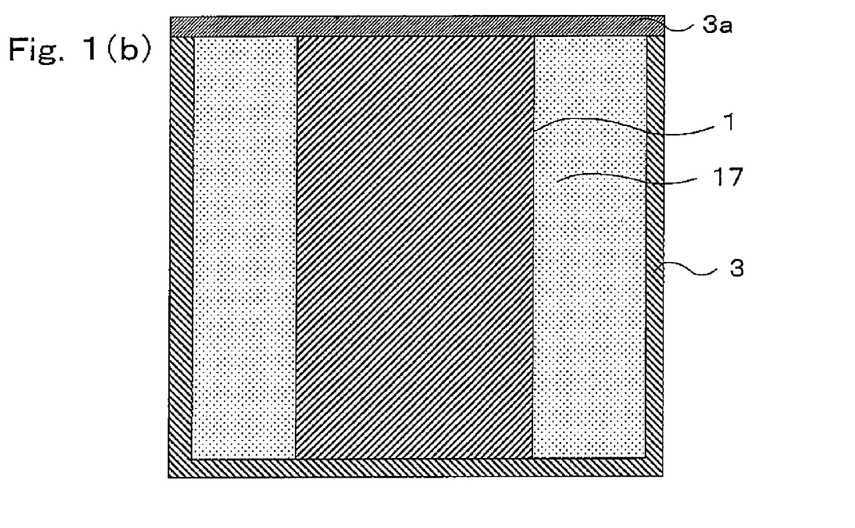
FIG. 1(b) is a sectional view of (a).

As shown in FIG. 1(a) and FIG. 1(b), the piezoelectric actuator unit comprises the multi-layer piezoelectric element 1 and the case 3 which houses the multi-layer piezoelectric element 1. The case 3 may be made of plastics, but is preferably made of a metal of high durability, and is more preferably made of stainless steel. A lid 3aa of the case 3 is preferably made of the same material as the case 3. The multi-layer piezoelectric element 1 is preferably interposed between the lid 3aa and the bottom of the case 3. For securing the multi-layer piezoelectric element 1 in the case 3, securing means such as a positioning pin or an adhesive is used.

In order to maintain insulation between the case 3 and the multi-layer piezoelectric element 1, and protect the multi-layer piezoelectric element 1 from the ambient atmosphere and moisture, it is preferable to fill a space between the case 3 and the multi-layer piezoelectric element 1 with a filling material 17. The filling material 17 is preferably formed from a resin, particularly silicone resin, urethane resin or epoxy resin, so as to accommodate the deformation of the multi-layer piezoelectric element 1 during operation.

Figures 2A, 2B:
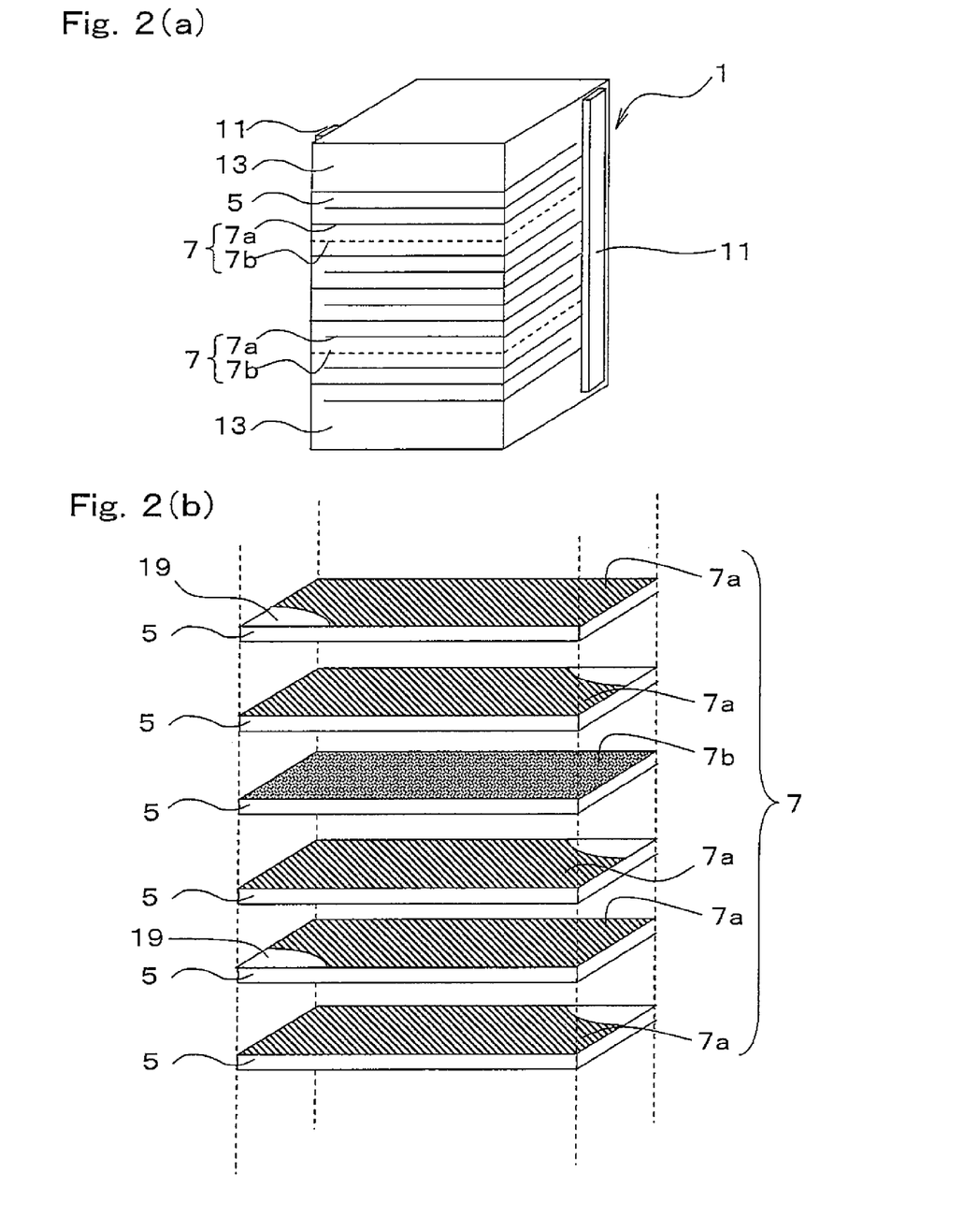
FIG. 2(a) is a perspective view showing the multi-layer piezoelectric element of the embodiment.
FIG. 2(b) is a partial perspective view showing the piezoelectric layers and the metal layers being stacked one on another shown in FIG. 2(a).
Figure 3:
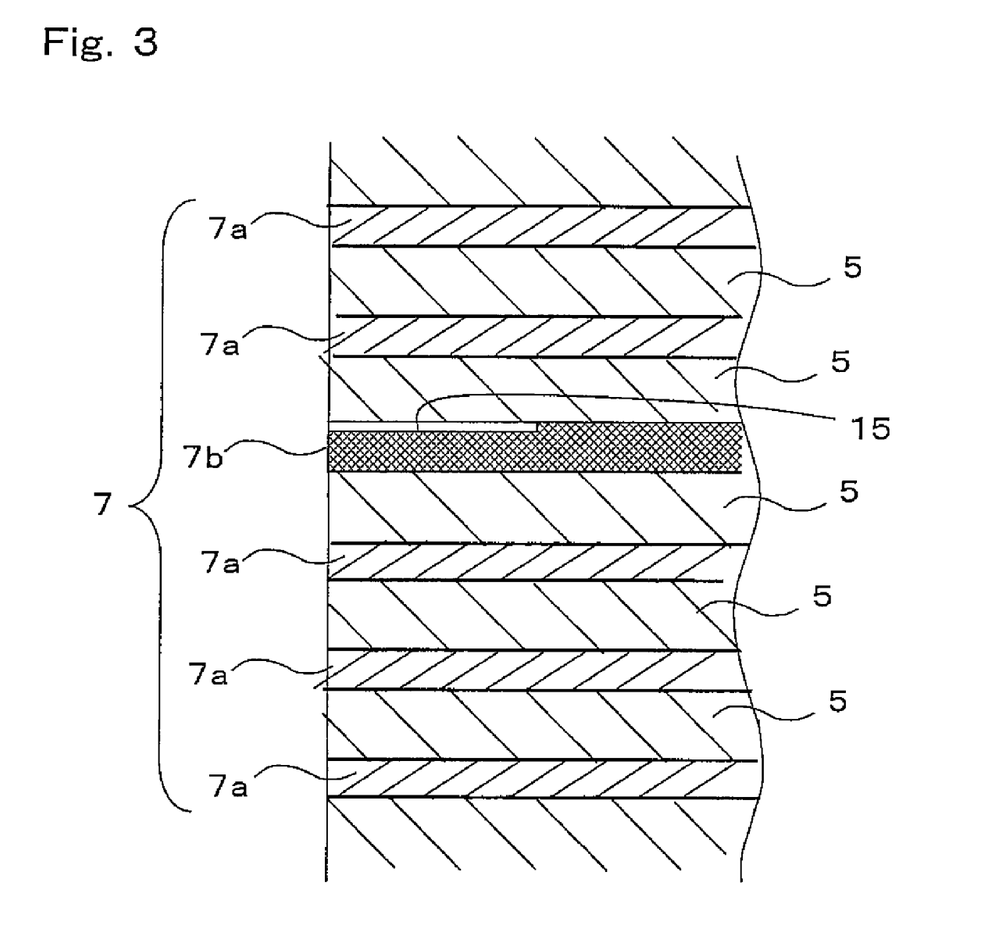
FIG. 3 is a partially enlarged sectional view showing the structure of stacking the multi-layer piezoelectric element according to the embodiment.
Figure 4:
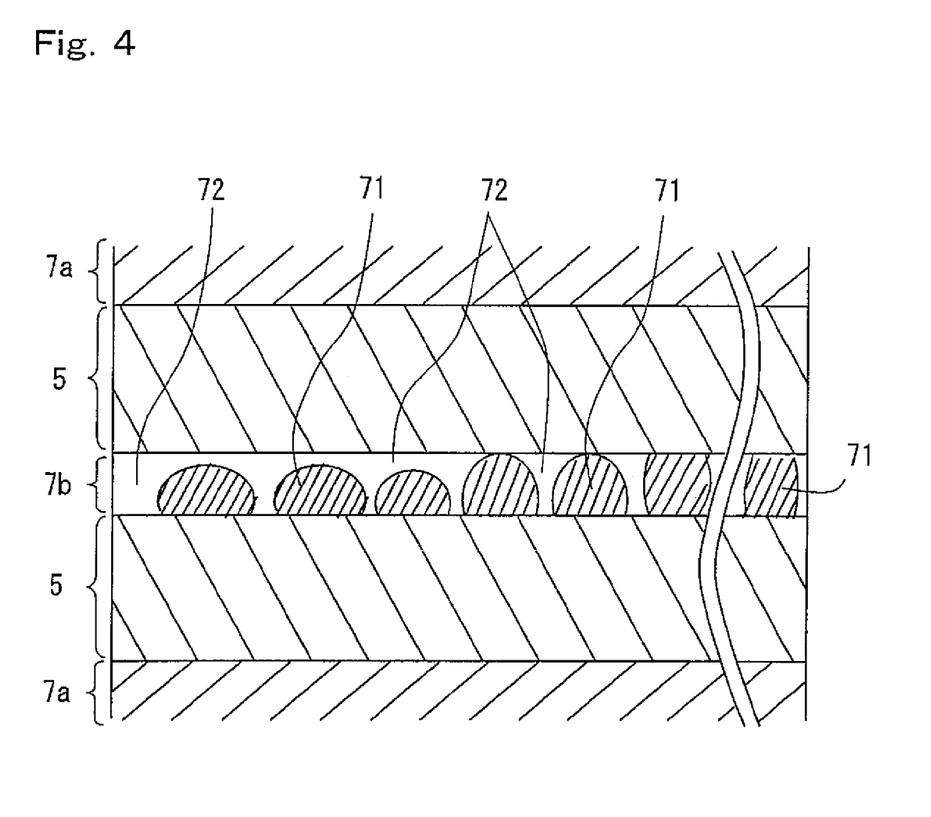
FIG. 4 is a partially enlarged sectional view showing the structure of stacking the stress relieving layer according to the embodiment.

FIG. 2(a) is a perspective view showing the multi-layer piezoelectric element 1 according to this embodiment, and FIG. 2(b) is an exploded perspective view of a part of the multi-layer piezoelectric element 1 explanatory of the internal structure of the multi-layer piezoelectric element 1 shown in FIG. 2(a). FIG. 3 is an enlarged sectional view of a region around the stress relieving layer of the multi-layer piezoelectric element 1 according to this embodiment. FIG. 4 is a sectional view showing the stress relieving layer depicted in FIG. 3 in a further enlarged view.

As shown in FIG. 2(a) and FIG. 2(b), the multi-layer piezoelectric element 1 comprises the stack 9 which has a plurality of piezoelectric layers 5 and a plurality of metal layers 7 with the piezoelectric layers 5 and the metal layers 7 being stacked one on another. Inactive layers 13, 13 formed from piezoelectric material are stacked on both end faces of the stack 9 in the direction of stacking. A pair of external electrodes 11, 11 are formed on a pair of opposing side faces of the stack 9.

The pair of external electrodes 11 are connected with lead wires (not shown) by soldering. The lead wires are connected to an external power source (not shown). A predetermined voltage is applied from the external power source through the lead wires between the adjacent internal electrode layers 7a, so that the piezoelectric layers 5 undergo displacement due to the reverse piezoelectric effect. The inactive layers 13 do not undergo displacement even when a voltage is applied since the internal electrode layer 7a is provided only on one principal surface without the internal electrode layer 7a provided on the other principal surface.

The plurality of metal layers 7 consist of the internal electrode layers 7a which function as the internal electrodes and the stress relieving layers 7b which have the stress relieving function. The internal electrode layer 7a is not formed over the entire principal surface of the piezoelectric layers 5, but is formed in the so-called partial electrode structure. In other words, a no-electrode section 19 exists where the internal electrode layer 7a is not formed on the principal surface of the piezoelectric layers 5. The plurality of the internal electrode layers 7a having the partial electrode structure are disposed so as to be exposed alternately on the opposing side faces of the stack 9. In this constitution, the internal electrode layers 7a are electrically connected alternately to the pair of external electrodes 11, 11. In this embodiment, the pair of external electrodes 11, 11 are formed on the opposing side faces of the stack 9, but may also be formed on adjacent side faces.

At least one of the plurality of metal layers 7 is the stress relieving layer 7b. As shown in FIG. 4, the stress relieving layer 7b consists mainly of a plurality of partial metal layers (metal particles) 71 that are scattered throughout the entire region between the two piezoelectric layers 5, 5 adjoining in the direction of stacking, and the voids. The plurality of partial metal layers 71 are preferably isolated from each other by the voids 72, for the purpose of insulation. When the plurality of partial metal layers 71 are isolated from each other by the voids 72 in this way, the stress relieving layer 7b does not function as the internal electrode and therefore does not short-circuit the external electrodes 11, 11 of opposite polarities.

When the stress relieving layer 7b consists of metal and voids as described above, both the metal and the voids can deform under a stress, and therefore piezoelectric actuator unit having high durability can be obtained. In case the stress relieving layer 7b consists of the plurality of partial metal layers 71 which are disposed in the state of being isolated from each other by the voids 72, a part of the piezoelectric layers 5 adjacent to the stress relieving layer 7b, which faces the voids 72, does not undergo displacement even when a voltage is applied to the element 1. Therefore, the piezoelectric layers 5 adjacent to the stress relieving layer 7b undergoes smaller amount of displacement so that concentration of stress of the element at a point can be avoided. On the other hand, the portion of the piezoelectric layer 5 which faces the voids 72 can deform easily, and is likely to deform under a stress during operation so as to provide a better effect of relieving the stress (stress relieving effect of the piezoelectric layer).

Void ratio in the stress relieving layer 7b is preferably in a range from 20% to 90%. In order to ensure durability and stress relieving effect at the same time, void ratio is more preferably in a range from 40% to 90%, and furthermore preferably from 60% to 85%. By setting the void ratio to 20% or more, it is made possible to prevent the force of the stress relieving layer 7b to constrain the piezoelectric layer 5 from increasing, so that generation of internal stress can be suppressed as the amount of displacement of the element 1 increases. By setting the void ratio to 90% or less, it is made possible to suppress the strength of the stress relieving layer 7b from decreasing.

Void ratio in the internal electrode layer 7a is preferably in a range from 5% to 70%, more preferably from 7% to 70%, and furthermore preferably from 10% to 60%. By controlling the void ratio within this range, it is made possible to allow the piezoelectric layers 5 to deform smoothly and maintain sufficient electrical conductivity, and therefore the amount of displacement of the multi-layer piezoelectric element 1 can be suppressed from decreasing. By setting the void ratio in the internal electrode layer 7a to 5% or more, it is made possible to prevent the force of the internal electrode layer 7a to constrain the piezoelectric layer 5 from becoming excessively high. By setting the void ratio in the internal electrode layer 7a within 70%, it is made possible to prevent a part of the metal that constitutes the internal electrode layer 7a from becoming extremely thin or being isolated. Thus it is made possible to maintain sufficient electrical conductivity of the internal electrode layer 7a and prevent the strength of the internal electrode layer 7a from decreasing.

The peel-off section 15 is formed at least in a part of the interface between the stress relieving layer 7b and the piezoelectric layer 5 which adjoins the former. With such a constitution as described above where the stress relieving layer 7b consists of a plurality of the partial metal layers 71 separated by the voids 72 with the peel-off section 15 provided in the interface with the piezoelectric layer 5, progressive stress relieving function is achieved such that the plurality of partial metal layers 71 peel off the piezoelectric layer 5 successively after starting at the peel-off section 15 so as to absorb stress, when the element 1 is subjected to stress.

Also as the voids 72 exist between the partial metal layers 71, the stress relieving layer 7b and the piezoelectric layer 5 can be prevented from coming apart from each other at once throughout the entire interface therebetween. Moreover, since the metal that constitutes the partial metal layer 71 is softer than the piezoelectric material particles that constitute the piezoelectric layer 5, the partial metal layer 71 has higher effect of relieving the stress than the piezoelectric layer. The voids 72 also have the effect of cushioning. As a result, the piezoelectric actuator unit having very high stress relieving effect and high durability can be obtained.

The reason why the effects described above are achieved is supposedly as follows. When the piezoelectric actuator unit is driven to generate a stress in the multi-layer piezoelectric element 1, the stress is concentrated in the stress relieving layer 7b which has the lowest strength. Bonding strength between the piezoelectric material particles and the metal particles which are made of different materials is lower than the bonding strength between the piezoelectric material particles and the bonding strength between the metal particles. Also the stress relieving layer 7b consisting of a plurality of the partial metal layers 71 has smaller area of bonding with the piezoelectric layer 5 in comparison to other internal electrode layers 7a. As a result, the bonding strength between the stress relieving layer 7b and the piezoelectric layer 5 is less than the bonding strength between the internal electrode layer 7a and the piezoelectric layer 5. Therefore, when the stress is generated in the element 1, stress is likely to be concentrated between the scattered partial metal layers 71 and the piezoelectric layer 5. When the stress relieving layer 7b is subjected to the stress, the partial metal layers 71 peel off the piezoelectric layer 5 successively so as to absorb the stress. This process of peel-off starts in the peel-off section 15 which is formed at least in a part of the interface between the stress relieving layer 7b and the piezoelectric layer 5 adjoining therewith.

Also as the plurality of partial metal layers 71 are scattered throughout the entire region between the two piezoelectric layers 5, stress can be absorbed regardless of whichever the direction the element 1 is subjected to the stress. Also because the partial metal layers 71 are scattered, the stress relieving layer 7b does not function as the internal electrode. Therefore, the amount of displacement of the element 1 does not change even when the peel-off of the stress relieving layer 7b from the peel-off layer 15 proceeds, and therefore stable displacement can be maintained over a long period of time.

Since the bonding strength between the piezoelectric material 11 is higher than the bonding strength between the piezoelectric layer 5 which is non-metallic material and the metal layer 7, a crack generated in the interface between the stress relieving layer 7b consisting of the plurality of the partial metal layers 71 and the piezoelectric layer 5 cannot propagate into the piezoelectric layer 5. Thus it is made possible to prevent the crack from penetrating the piezoelectric layer 5 in the direction of thickness thereof, and prevent the internal electrode layers 7a which oppose each other from short-circuiting.

Moreover, even when all the partial metal layers 71 provided in the stress relieving layer 7b have peeled off the piezoelectric layer 5 after a long period of operation, the element 1 is housed in the case 1 and therefore never breaks off. In addition, the stress relieving layer 7b with all the partial metal layers 71 of which have peeled off has smaller force to constrain the relative movement between the piezoelectric layers 5 provided on both sides in the stacking direction, thus allowing the relative movement between the piezoelectric layers 5, so as to remain functional as the stress relieving layer. Thus it is made possible to provide a piezoelectric actuator unit which shows high durability in continuous operation under a high voltage and a high pressure over a long period of time.

In case there are fewer voids 72 in the stress relieving layer 7b and much non-metallic, insulating material is included, stress may be concentrated in the portion of the insulating material during operation of the element 1, thus giving rise to the possibility of crack to be generated by the concentrated stress and develop in the direction of thickness of the piezoelectric layer 5. When the stress relieving layer 7b includes a number of voids 72, in contrast, presence of the voids 72 makes it easier for the partial metal layers 71 to deform when the partial metal layers 72 are subjected to the stress, so as to disperse the stress. Thus the piezoelectric layer 5 is prevented from being penetrated by crack in the direction of thickness.

When the multi-layer piezoelectric element 1 undergoes displacement due to the piezoelectric effect, presence of the voids 72 causes the piezoelectric layer 5 to be partially clamped. Thus the force of constraining the piezoelectric layer 5 becomes smaller than in the case where the metal layer 7 clamps the piezoelectric layer 5 over the entire surface thereof. This makes it easier for the piezoelectric layer 5 to undergo displacement and increases the amount of displacement. As a result, it is made possible to provide a piezoelectric actuator unit which shows a larger amount of displacement and high durability.

Proportion of the voids 72 in the stress relieving layer 7b (void ratio) can be determined by observing a section of the multi-layer piezoelectric element 1 cut in the direction of stacking. Specifically, the area of the voids 72 included in the stress relieving layer 7b in the section of the element 1 is measured, and the total area of the voids 72 is divided by the area of the entire stress relieving layer 7b, with the division multiplied by 100. The void ratio may be determined, for example, by applying a known technique of image processing to an image obtained by means of a scanning electron microscope (SEM).

The stress relieving layer 7b is preferably disposed in plurality in the stacking direction of the element 1. This constitution enables it to disperse the stress generated in the element 1 over a plurality of positions, so as to further improve the durability. In this case, the plurality of stress relieving layers 7b are preferably disposed via a plurality of the piezoelectric layers 5. This is because disposing the stress relieving layers 7b continuously in the element 1 causes the stress generated in the element 1 to be concentrated in the stress relieving layer 7b which is formed continuously. When the plurality of the stress relieving layers 7b are disposed via a plurality of the piezoelectric layers 5, in contrast, stress can be effectively distributed in the element 1. The plurality of the stress relieving layers 7b are more preferably disposed in a regular arrangement in the stacking direction of the element 1, which leads to uniform distribution of stress in the stacking direction of the element 1.

The stack 9 has preferably a shape of prism having polygonal cross section. This is because, in case the stack 9 has a cylindrical shape, layers formed in a shape of true circle with high precision must be stacked since deviation from true circle results in misalignment of the central axis. Thus it is difficult to employ a manufacturing method designed for mass production based on fire-at-once process. Layers formed in substantially circular shape may be stacked and, after being fired in case it is preferable, ground on the circumference into cylindrical shape. But this process makes it difficult to align the center axes of the metal layers 7 with high precision. Polygonal prism configuration, in contrast, enables it to form the metal layers 7 on the piezoelectric layer 5 having a predetermined datum line, and stack the layers in alignment with the datum line. As a result, the center axis can be formed as the axis of operation by a manufacturing method designed for mass production so as to make a device having high durability.

The stress relieving layers 7b are preferably constituted mainly from silver. With this constitution, the stress relieving layers 7b can be fired together with the piezoelectric layer 5 at the same time. Moreover, since silver has high heat conductivity, heat can be dissipated efficiently even when local heating occurs in a part of the element 1 due to stress concentration. Also because the stress relieving layers 7b are constituted mainly from silver, the partial metal layers 71 without oxide film formed thereon can be formed. Thus, since the partial metal layers 71 having high flexibility can be formed, the effect of relieving stress is improved. The stress relieving layers 7b may be formed, for example, from silver-palladium alloy. The internal electrode layer 7a may be formed, for example, from silver-palladium alloy.

In this embodiment, it is preferable that such a metal compound is included in the metal layer 7 as the main component that proportion M1 (% by weight) of palladium and proportion M2 (% by weight) of silver in the metal layer 7 (the internal electrode layer 7a and the stress relieving layers 7b) satisfy relations of 0<M1≦15, 85≦M2<100 and M1+M2=100. This is because a proportion of palladium higher than 15% by weight results in high specific resistance of the metal layer which causes the metal layer 7 to generate heat when the multi-layer piezoelectric element 1 is operated continuously, while the heat affects the piezoelectric layer 5 which has temperature dependency, thus deteriorating the displacement characteristic. As a result, the amount of displacement of the multi-layer piezoelectric element 1 may decrease.

When the external electrode 11 is formed, the external electrode 11 and the metal layer 7 are joined together through mutual diffusion of metallic components between these members. In case the proportion of palladium in the metal layer 7 is higher than 15% by weight, hardness of the portion of the external electrode 11 where the component of the metal layer is diffused may become higher, thus resulting in lower durability of the multi-layer piezoelectric element 1 that undergoes dimensional change during operation.

In order to suppress silver included in the metal layer 7 from migrating into the piezoelectric layers 5, it is preferable to control the proportion of palladium in a range from 0.001 to 15% by weight. In order to improve the durability of the multi-layer piezoelectric element 1, proportion of palladium is preferably in a range from 0.1 to 10% by weight. When high heat conductivity and high durability are required, proportion of palladium is preferably in a range from 0.5 to 9.5% by weight. When even higher durability is required, proportion of palladium is more preferably in a range from 2 to 8% by weight.

When the proportion of silver in the metal layer 7 is less than 85% by weight, specific resistance of the metal layer 7 becomes higher. This may lead to a significant amount of heat generated from the metal layer 7 during continuous operation of the multi-layer piezoelectric element 1. In order to suppress silver included in the metal layer 7 from migrating into the piezoelectric layers 5, it is preferable to control the proportion of silver in the metal layer 7 in a range from 85 to 99.999% by weight. In order to improve the durability of the multi-layer piezoelectric element 1, proportion of silver is preferably in a range from 90 to 99.9% by weight. When higher durability is required, proportion of silver is preferably in a range from 90.5 to 99.5% by weight. When even higher durability is required, proportion of silver is more preferably in a range from 92 to 98% by weight.

Compositions of the stress relieving layers 7b and the internal electrode layer 7a may be determined as follows. The stack 9 is cut off along the interface between the stress relieving layers 7b and the piezoelectric layer 5 so as to expose the stress relieving layers 7b, and a part of the stress relieving layers 7b is sampled. The sample of the stress relieving layers 7b is subjected to chemical analysis such as ICP (induction coupled plasma) emission analysis, so as to determine the composition. A section of the multi-layer piezoelectric element 1 cut in the stacking direction may also be analyzed by a method such as EPMA (Electron Probe Micro Analysis). Observation of the metal layer in a section of the multi-layer piezoelectric element 1 under an SEM (scanning electron microscope) or a metallurgical microscope may reveal the existence of non-metallic component such as voids 72 and/or metal components such as ceramics. In such a case, too, the composition in a region other than the voids 72 may be analyzed by EPMA or the like.

It is preferable that the piezoelectric layer 5 includes perovskite type oxide as the main component. When the piezoelectric layer 5 is formed from perovskite type piezoelectric ceramic material such as barium titanate ($BaTiO_3$), for example, it has high piezoelectric strain constant $d_{33}$ which enables it to increase the amount of displacement, and also enables the piezoelectric layer 5 and the metal layer 7 to be fired at the same time. It is also preferable that the piezoelectric layer 5 includes perovskite type oxide consisting of lead titanate zirconate ($PbZrO_3$—$PbTiO_3$), that has a relatively high value of piezoelectric strain constant $d_{33}$, as the main component.

A method for manufacturing the piezoelectric actuator unit of the present invention will now be described. A method for manufacturing the multi-layer piezoelectric element 1 will first be described. First, a calcined powder of a piezoelectric ceramic material constituted from perovskite type oxide consisting of $PbZrO_3$—$PbTiO_3$ or the like, a binder made of an organic polymer such as acrylic resin or butyral resin and a plasticizer such as DBP (dibutyl phthalate) or DOP (dioctyl phthalate) are mixed so as to form a slurry. The slurry is formed into ceramic green sheets, which would become the piezoelectric layers 5, by a known method such as doctor blade process or calender roll process or other tape molding method.

Then a metal powder such as silver-palladium that constitutes the metal layer 7, a binder and a plasticizer are mixed to prepare an electrically conductive paste which is applied onto the top surface of the green sheets by screen printing method or the like to a thickness of 1 to 40 μm.

In the portion where the stress relieving layers 7b is to be formed, an electrically conductive paste prepared by adding resin beads such as acrylic beads to a metal powder such as silver-palladium, and mixing a binder, a plasticizer, etc. therewith may be printed. Alternatively, the electrically conductive paste may also be printed after forming a dot pattern, so that the partial metal layers 71 which have been sintered are constituted from metal particles isolated from each other by the voids 72, for the purpose of insulation. Also such a process may be employed as a dot pattern of silver is formed by thin film forming technology such as sputtering, an electrically conductive paste is printed thereon and plurality of the partial metal layers 71 are formed through nucleation of the metal particles during sintering.

The stress relieving layers 7b may also be formed by printing an electrically conductive paste including a metal powder such as silver-palladium with the proportion of silver set higher than that in the electrically conductive paste used for the internal electrode 12a, so as to cause the silver to diffuse by the effect of the gradient of concentration formed by the difference in the concentration of silver between the metal layers during firing, so that the partial metal layers 71 are constituted from metal particles 16a isolated from each other by the voids 72, for the purpose of insulation. In this case, the metal powder may also be a mixture of silver powder and palladium powder of controlled proportions, rather than the powder of silver-palladium alloy. Silver powder or palladium powder may also be added to the powder of silver-palladium alloy, with the composition of the mixture being controlled thereafter. It is preferable to use alloy powders of compositions controlled separately, in order to make uniform dispersion of the metals in the paste and uniform composition within the same plane of the internal electrode layers 7a and the stress relieving layer 7b.

A plurality of the green sheets having the electrically conductive paste printed thereon are stacked one on another, and the stack is heated at a predetermined temperature to remove the binder. The stack is then fired at a temperature in a range from 900 to 1200° C. thereby to make the stack 9.

When the metal powder such as silver-palladium that constitutes the metal layer 7 is added to the green sheet that forms of the inactive layer 14, or a slurry consisting of the metal powder such as silver-palladium that constitutes the metal layer 7, an inorganic compound, a binder and a plasticizer is printed on the green sheets when the green sheets that form the inactive layer 14 are stacked, shrinking behavior and shrinking rate can be matched between the inactive layer 14 and the other portions during sintering, thus making it possible to form the stack 9 of high density.

The method of making the stack 9 is not limited to that described above, and any manufacturing method may be employed as long as the stack 9 can be made in such a constitution as a plurality of the piezoelectric layers 5 and a plurality of the metal layers 7 are stacked alternately one on another.

Then an electrically conductive silver-glass paste is prepared by adding a binder to a glass powder, and the paste is printed on the external electrode forming surface of the stack 9, and the stack is baked at a temperature that is higher than the softening point of the glass and is not higher than the melting point (965° C.). Thus the external electrode 11 is formed from the electrically conductive silver-glass paste.

At this time, the paste that constitutes the external electrode 11 may be applied in multiple layers and then baked at once, or a single layer may be baked. For the reason of convenience in mass production, it is preferable that multiple layers are formed and then baked at once. When the layers having different contents of the glass component are to be formed, the layers may be formed while varying the quantity of the glass component included in each layer one by one. When it is necessary to form a very thin glass-rich layer in contact with the piezoelectric layer 5, a glass-rich paste may be printed on the stack 9 by screen printing process or the like, and the multiple sheets may be stacked thereon.

Then the multi-layer piezoelectric element 1 formed as described above is housed in a cylindrical case made of a metal such as stainless steel, and the space between the case 3 and the multi-layer piezoelectric element 1 is filled with the filling material 17 such as silicone resin which forms an insulation layer. At this time, such a procedure may also be employed as the multi-layer piezoelectric element 1 is placed in a cylindrical jig which is then filled with a resin, the multi-layer piezoelectric element 1 coated with the resin is then taken out of the jig and is put into the cylindrical case 3 made of metal.

The case 3 is then sealed with the lid 3a. While sealing may be carried out by bonding by means of adhesive, soldering or brazing, welding is preferable for the reason of high durability. In this case, a plurality of holes may be drilled in the side face of the cylindrical case 3, in which case the case 3 acts like a spring so that such a piezoelectric actuator unit is obtained as the multi-layer piezoelectric element 1 is subjected to compressive stress in the stacking direction, when the lid 3a is welded.

Then a DC voltage from 0.1 to 3 kV/mm is applied between the pair of external electrodes 11 via lead wires which are connected to the external electrodes 11 so as to apply polarization treatment to the element 1. This causes the piezoelectric actuator unit incorporating the element 1 to expand with the stress generated thereby acting on the stress relieving layer 7b. As a result, among the plurality of partial metal layers 71 that are scattered throughout the entire region between two piezoelectric layers 5, a part where higher stress is concentrated peels off the adjacent piezoelectric layer 5 so as to form a peel-off section (slit). Since the stress is most likely concentrate in the side face of the element 1, the partial metal layers 71 located on the side face of the element 1 peels off the piezoelectric layer 5, so as to form such a peel-off section as shown in FIG. 3. Application of the polarization reversal treatment, in particular, can cause expansion and shrinkage of the element 1 to occur violently in a short time, and therefore the peel-off section 15 can be formed effectively.

At this time, in case the polarization treatment is carried out without placing the multi-layer piezoelectric element 1 in the case 3, the multi-layer piezoelectric element 1 is not held sufficiently when the multi-layer piezoelectric element 1 expands. As a result, the multi-layer piezoelectric element 1 is not able to expand in the stacking direction without deviation in accordance to the misalignment of stacking between the internal electrode layers 7a and to the variation in the insulation distance on the side face of the element 1. Thus strain occurs in the direction of expansion and it becomes impossible to control the stress generated in the side face of the element 1, eventually resulting in cracks in the piezoelectric layer 5. When the multi-layer piezoelectric element 1 is housed in the case 3, in contrast, expansion of the multi-layer piezoelectric element 1 can be restricted within the stacking direction, and it is made possible to control so that the peel-off section 15 is formed only in the stress relieving layer 7b that consists of the plurality of partial metal layers 71 which are scattered throughout the entire region between two piezoelectric layers 5. When the case 3 is rendered with the property of spring, in particular, the piezoelectric actuator unit can expand only when the tensile stress excels the compressive stress as the compressive stress is generated in counter to the expansion. Accordingly, since the stress relieving layer 7b consisting of the plurality of partial metal layers 71 which are scattered throughout the entire region between two piezoelectric layers 5 does not function as the internal electrode, the surrounding piezoelectric layers 5 do not contribute to the expansion so that compressive stress is concentrated therein, unlike the piezoelectric layers 5 which expand, thus resulting in the formation of peel-off section 15.

Moreover, a wiring comprising mesh- or comb-shaped metal may be joined onto the outer surface of the external electrodes 11 by means of an electrically conductive adhesive or by soldering. Such a wiring allows it to flow a large current in the vicinity of the internal electrode and decrease the current flowing in the external electrodes 11, when the actuator is operated at a high speed by supplying a large current. Accordingly, it is made possible to prevent the external electrodes 11 from undergoing wire breakage due to local heating, thus greatly improving the durability.

The electrically conductive particles are more preferably non-spherical particles having such shapes as flakes or acicular particles. When the electrically conductive particles are non-spherical particles such as flakes or acicular particles, the electrically conductive particles can be firmly entwined with each other, thereby increasing the shear strength of the electrically conductive adhesive.

One embodiment of the present invention has described, although the multi-layer piezoelectric element 1 of the present invention is not limited to the embodiment described above, and various modifications can be made within the scope of the present invention.

For example, while all the metal layers are made of alloy in the embodiment described above, such a constitution may also be employed as part of the metal layers is formed from an alloy and the rest is formed from a metal element. While the metal layers include the same components in the embodiment described above, the metal layers may also consist of two or more kinds which include different elements as the main components.

As will be apparent from the foregoing description, the piezoelectric actuator unit of this embodiment is capable of not only obtaining a large amount of displacement but also maintaining high reliability even when the multi-layer piezoelectric element 1 is subjected to a transient surge voltage due to a noise in the power source, or the piezoelectric actuator-unit is operated continuously over a long period of time under conditions of high temperature, high humidity, high electric field and a high pressure.

<Injection Apparatus>

Figure 5:
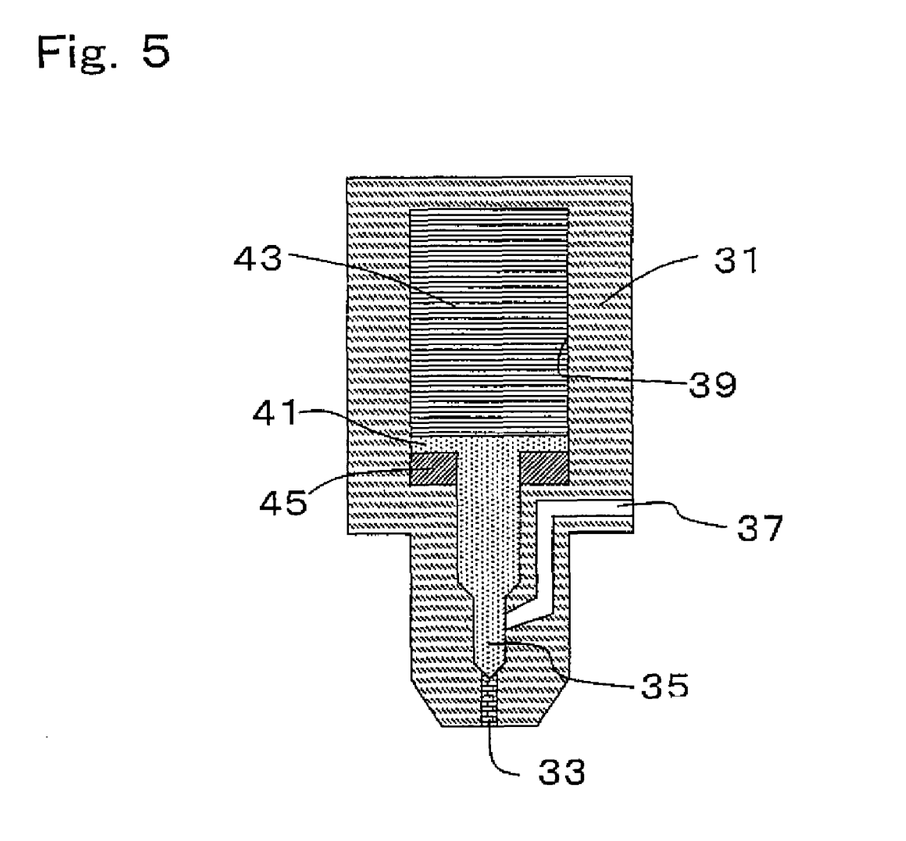
FIG. 5 is a sectional view schematically showing the injection apparatus according to the embodiment of the present invention.

FIG. 5 is a sectional view schematically showing an injection apparatus according to one embodiment of the present invention. As shown in FIG. 5, the injection apparatus of this embodiment comprises a piezoelectric actuator unit 43 of the present invention exemplified by the embodiment described above being housed in a container 31 which has a injection hole 33 formed at one end thereof. Disposed in the container 31 is a needle valve 35 which is capable of opening and closing the injection hole 33. The injection hole 33 is provided with a fuel passage 37 disposed so as to communicate therewith in accordance to the movement of the needle valve 35. The fuel passage 37 is connected to a fuel source that is provided outside of the apparatus, so as to receive a fuel supplied thereto at a high pressure that remains always constant. When the needle valve 35 opens the injection hole 33, the fuel that fills the fuel passage 37 is injected at a predetermined level of high pressure into a fuel chamber of an internal combustion engine (not shown).

The needle valve 35 has an enlarged top portion where the inner diameter is made larger. A cylinder 39 of the container 31 has the piezoelectric actuator unit 43, provided with the multi-layer piezoelectric element 1, housed therein. Disposed at the bottom end of the unit 43 is a piston 41 which makes sliding motion with respect to the cylinder 39.

In such an injection apparatus, when the piezoelectric actuator unit 43 expands in response to a voltage applied thereto, the piston 41 is pressed so that the needle valve 35 plugs the injection hole 33, thereby stopping the supply of fuel. When the voltage is removed, the piezoelectric actuator unit 43 shrinks and a Belleville spring 45 pushes back the piston 41, so that the injection hole 33 communicates with the fuel passage 37 and the fuel is discharged.

The present invention relates to the piezoelectric actuator unit, although the present invention is not limited to the embodiment described above, and various modifications can be made within the scope of the present invention. The piezoelectric actuator unit of the present invention can be used in, for example, fuel injection apparatus of automobile engine, liquid injection apparatus of ink jet printer or the like or a drive unit used in precision positioning device or vibration preventing device for an optical apparatus, sensor element mounted in combustion pressure sensor, knocking sensor, acceleration sensor, load sensor, ultrasound sensor, pressure sensor, yaw rate sensor or the like, or used as a circuit component mounted in piezoelectric gyro, piezoelectric switch, piezoelectric transducer, piezoelectric breaker or the like, as long as the piezoelectric property is utilized.

EXAMPLE

A piezoelectric actuator unit having a multi-layer piezoelectric element was made as follows. First, a calcined powder of a piezoelectric ceramic material constituted from lead titanate zirconate ($PbZrO_3$—$PbTiO_3$) having mean particle size of 0.4 μm as the main component, a binder and a plasticizer were mixed to form a slurry which was formed into ceramic green sheets that would become the piezoelectric layers 5 having thickness of 100 μm after firing.

An electrically conductive paste, prepared by adding a binder to the alloy consisting mainly of silver-palladium so as to have the composition shown in Table 1, was applied to one side of the ceramic green sheet by screen printing method. Then 300 pieces of the ceramic green sheets were stacked and fired at a temperature of 1000° C. for 2 hours after holding the temperature at 800° C. for 2 hours.

In the portion where the stress relieving layers 16 was to be formed, an electrically conductive paste prepared by adding silver in excess and a binder to silver-palladium alloy so as to have the composition shown in Table 1 was printed. The stress relieving layers 16 constituted from a plurality of metal particles 16a which are insulated from each other was disposed in the $50^{th}$ layer, the $100^{th}$ layer, the $150^{th}$ layer, the $200^{th}$ layer and the $250^{th}$ layer. The stress relieving layer 16 was printed in the shape shown in FIG. 1(b) so that a junction section 17 can be formed.

Then a mixture of silver powder of flake-like particles having mean particle size of 2 μm and amorphous glass powder having softening point of 640° C. including silicon having mean particle size of 2 μm as the main component was mixed with 8 weight parts of binder in proportion to 100 weight parts in total of silver powder and glass powder, so as to prepare the electrically conductive silver-glass paste by fully mixing the powders. The electrically conductive silver-glass paste thus prepared was printed onto to external electrodes 11 of the stack 9, and was baked at 700° C. for 30 minutes thereby to form the external electrodes 11.

Then the multi-layer piezoelectric element 1 was placed in a container made of spring steel and was filled with silicone resin. A lid 3 made of spring steel was welded thereon, thereby making the piezoelectric actuator unit.

Then with lead wires connected to the external electrodes 11, an AC electric field having sinusoidal waveform of 20 Hz from 0 to 2 kV/mm was applied between the positive and negative external electrodes 11 via the lead wires for 15 minutes so as to apply polarization treatment. At this time, noise can be heard which is characteristic to the phenomenon of peel-off section (slit) being formed by polarization. Results are shown in Table 1 for a case where single polarization was applied and a case where single polarization reverse treatment was applied by applying an AC electric field having sinusoidal waveform of 20 Hz from 0 to 2 kV/mm was applied for 15 minutes with the polarities of the lead wires reversed. The piezoelectric actuator unit having the multi-layer piezoelectric element 1 as shown in FIG. 1 was made as described above.

When a DC voltage of 150 V was applied to the multi-layer piezoelectric element 1, all piezoelectric actuator units showed displacements in the stacking direction.

Then an AC voltage of 150 Hz from 0 to +150 V was applied to the piezoelectric actuator unit at the room temperature, to carry out continuous operation of $1 \times 10^9$ cycles.

Measurement of the peel-off section was carried out by observing a cut section of the multi-layer piezoelectric element under an SEM and a metallurgical microscope, after removing the multi-layer piezoelectric element from the actuator unit that had been subjected to the operation test. In order to observe the sections of all the metal layers stacked, the element was cut so that the section lies along the stacking direction and connects portions of the two external electrodes near the centers thereof. Length of the peel-off section was determined by measuring the observed section and averaging the measurements. The results are shown in Table 1.

TABLE 1

| No. | Constitution of internal electrode layer and stress relieving layer | Polarization treatment or polarization reversion treatment | Length of peel-off layer (mm) | Compositions of metal components in electrically conductive paste for internal electrode layer 12a (% by weight) | Compositions of metal components in electrically conductive paste for stress relieving layer 12b (% by weight) | Displacement in initial state (μm) | Displacement after continuous operation (1 × 10$^9$ cycles) (μm) | Presence of crack penetrating piezoelectric layer in thickness direction |
|---|---|---|---|---|---|---|---|---|
| 1 | FIG. 3 | Polarization | 1.0 | Ag70% Pd30% | Ag80% Pd20% | 45.0 | 44.8 | No |
| 2 | FIG. 3 | Polarization reversion | 1.3 | Ag70% Pd30% | Ag80% Pd20% | 45.0 | 44.9 | No |
| 3 | FIG. 3 | Polarization | 1.5 | Ag80% Pd20% | Ag85% Pd15% | 50.0 | 49.8 | No |
| 4 | FIG. 3 | Polarization reversion | 1.8 | Ag80% Pd20% | Ag85% Pd15% | 50.0 | 49.9 | No |
| 5 | FIG. 3 | Polarization | 2.0 | Ag90% Pd10% | Ag95% Pd 5% | 55.0 | 54.9 | No |
| 6 | FIG. 3 | Polarization reversion | 2.6 | Ag90% Pd10% | Ag95% Pd 5% | 55.0 | 55.0 | No |
| 7 | FIG. 3 | Polarization | 3.0 | Ag95% Pd5% | Ag98% Pd 2% | 60.0 | 59.9 | No |
| 8 | FIG. 3 | Polarization reversion | 3.6 | Ag95% Pd5% | Ag98% Pd 2% | 60.0 | 60.0 | No |
| 9 | No stress relieving layer | Polarization | 0 | Ag80% Pd20% | Ag80% Pd20% | 45.0 | 20.0 | Yes |

As shown in Table 1, sample No. 9 made as Comparative Example without forming the stress relieving layer showed a small amount of displacement due to the stress concentrated in the interface between the metal layer and the piezoelectric layer, which resulted in a crack that penetrated the piezoelectric material between the internal electrodes.

Samples Nos. 1 through 8 made as Examples of the present invention, in contrast, showed effective amount of displacement required for a piezoelectric actuator unit without significant decrease in the amount of displacement after continuous operation of 1×10$^9$ cycles, and piezoelectric actuator unit having high durability was made.

The invention claimed is:

1. A piezoelectric actuator unit comprising:
   a multi-layer piezoelectric element having a plurality of piezoelectric layers and a plurality of metal layers, the piezoelectric layers and the metal layers being stacked one on another; and
   a case which houses the multi-layer piezoelectric element,
   wherein the plurality of metal layers comprise an internal electrode and a stress relieving layer which comprises a plurality of metal particles and voids, the metal particles being scattered throughout the entire region between two piezoelectric layers which adjoin the stress relieving layer in the direction of stacking,
   wherein the plurality of metal particles are scattered so as to be electrically separated from each other by the voids, and
   wherein a part of the plurality of metal particles are separated from the piezoelectric layer to form a peel-off section at least in a part of the interface between the stress relieving layer and the piezoelectric layer that adjoins therewith.

2. The piezoelectric actuator unit according to claim 1; wherein a plurality of the stress relieving layers are disposed in the direction of stacking of the multi-layer piezoelectric element.

3. The piezoelectric actuator unit according to claim 2; wherein the stress relieving layers are disposed in a regular arrangement in the direction of stacking of the multi-layer piezoelectric element.

4. The piezoelectric actuator unit according to claim 1, wherein the peel-off section is formed in the surrounding portion of the multi-layer piezoelectric element.

5. The piezoelectric actuator unit according to claim 1, wherein the stress relieving layer does not act as an internal electrode.

6. A piezoelectric actuator unit comprising:
   a multi-layer piezoelectric element having a plurality of piezoelectric layers and a plurality of metal layers, the piezoelectric layers and the metal layers being stacked one on another; and
   a case which houses the multi-layer piezoelectric element,
   wherein the plurality of metal layers comprises an internal electrode and a stress relieving layer which comprises a plurality of metal particles and voids, the metal particles are scattered throughout the entire region between two piezoelectric layers which adjoin the metal particles in the direction of stacking,
   wherein the plurality of metal particles are scattered so as to be electrically separate from each other by the voids,
   wherein at least one of the metal particles is disconnected from the piezoelectric layer that adjoins therewith.

7. The piezoelectric actuator unit according to claim 6, wherein the stress relieving layer does not act as an internal electrode.

8. A method for manufacturing the piezoelectric actuator unit which has a multi-layer piezoelectric element having a plurality of piezoelectric layers and a plurality of metal layers which comprise an internal electrode and a stress relieving layer, the piezoelectric layers and the metal layers being stacked one on another, and a case which houses the multi-layer piezoelectric element, the method comprising:

a process of making the multi-layer piezoelectric element in which the stress relieving layer comprises a plurality of metal particles and voids, the metal particles being scattered so as to be electrically separated from each other by the voids throughout the entire region between two piezoelectric layers adjoining in the direction of stacking; and a process of forming a peel-off section at least in a part of the interface between the metal particles and the piezoelectric layer that adjoins therewith by applying polarization treatment under the condition that the multi-layer piezoelectric element is housed in the case to separate a part of the plurality of metal particles from the piezoelectric layer.

* * * * *